(12) United States Patent
Van Damme

(10) Patent No.: US 7,704,679 B2
(45) Date of Patent: Apr. 27, 2010

(54) METHOD OF MAKING A LITHOGRAPHIC PRINTING PLATE

(75) Inventor: Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 0 days.

(21) Appl. No.: 12/093,600

(22) PCT Filed: Nov. 9, 2006

(86) PCT No.: PCT/EP2006/068306

§ 371 (c)(1),
(2), (4) Date: May 14, 2008

(87) PCT Pub. No.: WO2007/057349

PCT Pub. Date: May 24, 2007

(65) Prior Publication Data

US 2008/0254391 A1    Oct. 16, 2008

Related U.S. Application Data

(60) Provisional application No. 60/741,258, filed on Dec. 1, 2005.

(30) Foreign Application Priority Data

Nov. 18, 2005    (EP) .................................. 05110919

(51) Int. Cl.
G03C 5/26    (2006.01)
G03C 7/26    (2006.01)
B41N 1/00    (2006.01)

(52) U.S. Cl. .................. 430/302; 430/434; 101/454

(58) Field of Classification Search .............. 430/270.1, 430/302
See application file for complete search history.

(56) References Cited

U.S. PATENT DOCUMENTS

| | | | |
|---|---|---|---|
| 4,190,345 A | 2/1980 | Taylor | |
| 4,329,422 A * | 5/1982 | Langlais | ............. 430/331 |
| 4,370,406 A | 1/1983 | Jones | |
| 4,912,021 A | 3/1990 | Dhillon et al. | |
| 6,027,857 A | 2/2000 | Li et al. | |
| 6,071,675 A | 6/2000 | Teng | |
| 6,171,735 B1 | 1/2001 | Li et al. | |
| 6,245,481 B1 | 6/2001 | Teng | |
| 6,387,595 B1 | 5/2002 | Teng | |
| 6,420,089 B1 | 7/2002 | Baumann et al. | |
| 6,482,571 B1 | 11/2002 | Teng | |
| 6,548,222 B2 | 4/2003 | Teng | |
| 6,576,401 B2 | 6/2003 | Teng | |
| 7,316,891 B2 * | 1/2008 | Vander Aa et al. | ........... 430/302 |
| 2003/0031948 A1 * | 2/2003 | Fiebag et al. | ............... 430/165 |
| 2003/0165777 A1 | 9/2003 | Teng | |
| 2004/0013968 A1 | 1/2004 | Teng | |
| 2004/0214105 A1 | 10/2004 | Hoshi et al. | |
| 2005/0039620 A1 | 2/2005 | Kakino et al. | |

FOREIGN PATENT DOCUMENTS

| | | |
|---|---|---|
| EP | 0 851 299 A1 | 7/1998 |
| EP | 1 091 251 A2 | 4/2001 |
| EP | 1 342 568 A1 | 9/2003 |
| EP | 1 491 356 A2 | 12/2004 |
| EP | 1 495 866 A2 | 1/2005 |
| EP | 1 500 498 A2 | 1/2005 |
| EP | 1 520 694 A2 | 4/2005 |
| EP | 1 557 262 A2 | 7/2005 |
| WO | 02/101469 A1 | 12/2002 |
| WO | 2004/095141 A1 | 11/2004 |
| WO | 2005/111727 A1 | 11/2005 |
| WO | WO 2005111727 A1 * | 11/2005 |
| WO | 2006/037716 A1 | 4/2006 |

OTHER PUBLICATIONS

Williamson et al.; "Method of Making a Lithographic Printing Plate"; U.S. Appl. No. 12/093,153, filed May 9, 2008.
Van Damme; "Method of Making a Lithographic Printing Plate"; U.S. Appl. No. 12/093,160, filed May 9, 2008.
Van Damme; "Method of Making a Lithographic Printing Plate"; U.S. Appl. No. 12/093,602, filed May 14, 2008.
Van Damme; "Method of Making a Lithographic Printing Plate"; U.S. Appl. No. 12/093,470, filed May 13, 2008.
Williamson et al.; "Method of Making a Lithographic Printing Plate"; U.S. Appl. No. 12/093,366, filed May 12, 2008.
Gries et al.; "Method of Making a Photopolymer Printing Plate"; U.S. Appl. No. 12/093,473; filed May 13, 2008.
Van Damme; "Method of Making a Lithographic Printing Plate"; U.S. Appl. No. 12/093,376, filed May 12, 2008.
Official communication issued in the International Application No. PCT/EP2006/068306, mailed on Feb. 15, 2007.

* cited by examiner

*Primary Examiner*—Cynthia H Kelly
*Assistant Examiner*—Chanceity N Robinson
(74) *Attorney, Agent, or Firm*—Keating & Bennett, LLP

(57) ABSTRACT

A method of making a lithographic printing plate includes the steps of: a) providing a lithographic printing plate precursor including (i) a support having a hydrophilic surface or which is provided with a hydrophilic layer, (ii) a coating on the support, including a photopolymerizable layer and, optionally, an intermediate layer between the photopolymerizable layer and the support, wherein the photopolymerizable layer includes a polymerizable compound, a polymerization initiator and a binder, b) image-wise exposing the coating in a plate setter, c) optionally, heating the precursor in a pre-heating unit, d) treating the precursor in a gumming station, including a first and at least a second gumming unit, wherein the precursor is consecutively developed in the first and the second gumming unit with a gum solution, thereby removing non-exposed areas of the photopolymerizable layer from the support and gumming the plate in a single step.

13 Claims, No Drawings

METHOD OF MAKING A LITHOGRAPHIC PRINTING PLATE

CROSS-REFERENCE TO RELATED APPLICATIONS

This application is a 371 of PCT/EP2006/068306, filed Nov. 9, 2006. This application claims the benefit of U.S. Provisional Application No. 60/741,258, filed Dec. 1, 2005, which is incorporated by reference herein in its entirety. In addition, this application claims the benefit of European Application No. 05110919.7, filed Nov. 18, 2005, which is also incorporated by reference herein in its entirety.

BACKGROUND OF THE INVENTION

1. Field of the Invention

The present invention relates to a method for making a lithographic printing plate whereby a negative-working photopolymer printing plate precursor is image-wise exposed, treated with a gum solution in a gumming station, whereby the plate is developed and gummed in a single step.

2. Description of the Related Art

In lithographic printing, a so-called printing master such as a printing plate is mounted on a cylinder of the printing press. The master carries a lithographic image on its surface and a printed copy is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout, and imposition are accomplished digitally and each color selection is transferred to graphic arts film using an image-setter. After processing, the film can be used as a mask for the exposure of an imaging material called a plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided into three categories: (i) silver plates, which work according to the silver salt diffusion transfer mechanism; (ii) photopolymer plates which contain a photopolymerizable composition that hardens upon exposure to light; and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green, or red light (i.e., wavelength range between 450 and 750 nm), for violet light (i.e., wavelength range between 350 and 450 nm), or for infrared light (i.e., wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of platesetters operating at shorter wavelength. More specifically, semiconductor lasers emitting from 350 to 450 nm have been achieved using an InGaN material. An infrared laser diode emitting around 830 nm or a Nd-YAG laser emitting around 1060 nm can also be used.

Typically, a photopolymer plate precursor includes on a support, a photopolymerizable coating which includes a polymerizable compound, a polymerization initiator, and a binder. Upon image-wise exposure, free radicals formed by the initiator initiate crosslinking and/or polymerization of the polymerizable compound, resulting in hardening or curing of the exposed areas. The exposed precursor is usually processed in an alkaline developer having a pH>10, whereby the photopolymerizable coating at the non-exposed areas are solubilized in the developer solution.

Currently, most commercial lithographic plates require an additional gumming process after the exposed plate is developed and before it is put on the press, in order to protect the plate from contamination, e.g., by oxidation, fingerprints, fats, oil or dust, or from damaging, e.g., by scratches during handling of the plate. Such an additional gumming step is not convenient for the end-user because it is a time consuming step and requires an additional gumming station.

WO 02/101469 discloses a method of processing an imagable element useful as an alkaline-developable lithographic printing plate precursor wherein the element is developed and gummed with an aqueous alkaline developing-gumming solution including a water-soluble polyhydroxy compound having a specific structure.

EP 1 342 568 discloses a method for making a heat-sensitive lithographic printing plate wherein the image-wise heated precursor, including a coating of hydrophobic thermoplastic polymer particles which coalescence on heating, is developed with a gum solution. A practical preferred embodiment for this type of printing plate was introduced by Agfa under the trade name Azura.

In U.S. Pat. No. 6,027,857, U.S. Pat. No. 6,171,735, U.S. Pat. No. 6,420,089, U.S. Pat. No. 6,071,675, U.S. Pat. No. 6,245,481, U.S. Pat. No. 6,387,595, U.S. Pat. No. 6,482,571, U.S. Pat. No. 6,576,401, and U.S. Pat. No. 6,548,222, a method is disclosed for preparing a lithographic printing plate wherein a photopolymer plate, after image-wise exposure, is mounted on a press and processed on-press by applying ink and fountain to remove the unexposed areas from the support. Also, U.S. 2003/0016577 and U.S. 2004/0013968 disclose a method wherein a plate including a photopolymerizable layer can be processed on-press with fountain solution and ink or with a non-alkaline aqueous developer. An adhesion promoting compound can also be added to the printing plate precursor for improving the developability of the on-press processing and for improving the durability of the plate in the printing process. Typically, these compounds have an ethylenically unsaturated bond and a functional group capable of adsorbing to the surface of the support. Other compounds and polymers can be used as an adhesion promoting compound. The compound can be present in the photopolymerizable layer or in an intermediate layer between the support and the photopolymerizable layer as disclosed in EP 851 299, EP 1 091 251, U.S. 2004/214105, EP 1 491 356, U.S. 2005/39620, EP 1 495 866, EP 1 500 498, EP 1 520 694, and EP 1 557 262.

A first problem associated with on-press processing of such photopolymer printing plates is the lack of daylight stability, i.e., the image is not stable before processing and, therefore, the exposed plate needs to be processed within a short time after the exposure. However, since on-press processing is not possible during a print job, the end-user must wait until the previous print job has been completed before the exposed plate can be mounted on the press and processed. As a result, the exposure of the plate for the next print job must be delayed until just before the completion of the previous print job, so as to avoid that the unprocessed plate is affected by the ambient light. Alternatively, the exposed plate must be kept under safe-light conditions, but this again reduces the ease of use and convenience that are normally associated with, e.g., violet- and infrared-sensitive photopolymer plates.

A second problem left unsolved in the prior art about on-press processable photopolymer plates is the lack of a visible image between exposure and processing. Although it is known to add a colorant to the photosensitive coating, so as to obtain a visible image after removal of the non-exposed areas of the coating by the processing, this does not make it possible to distinguish an exposed plate from an unexposed plate immediately after the image-wise exposure, let alone to inspect the image quality after the exposure, because the visible image is only revealed after the on-press processing. Moreover, on-press processable plates normally do not contain a colorant because the on-press removal of the non-printing areas of the coating may cause contamination of the fountain solution and/or the ink and it may take an unacceptable number of printed copies before the contamination by the colorant has disappeared.

A third problem associated with on-press processing with fountain solution and ink is an insufficient clean-out of the non-exposed areas.

In WO 2005/111727, a method for making a lithographic printing plate is disclosed wherein the image-wise exposed precursor is developed with a gumming solution.

SUMMARY OF THE INVENTION

In order to overcome the problems described above, preferred embodiments of the present invention provide a method for making a lithographic printing plate from a photopolymer plate precursor, which is perceived by the user as a method which does not require a processing step and wherein the exposed plate can be kept in ambient light for an unlimited time before being mounted on the press. A preferred embodiment of the present invention includes a method having the specific feature that the image-wise exposed plate precursor is treated in a first and at least a second gumming unit with a gum solution, whereby the plate is developed and gummed in a single step. Since the plate is developed and gummed, the lithographic image can no longer be affected by ambient daylight. On the contrary, further exposure to daylight would only increase the polymerization degree of the exposed areas, i.e., would strengthen rather than deteriorate the image. In addition, the present inventors have discovered that by treating the precursor in the first gumming unit and, subsequently, in the second gumming unit, the life-time of the gum solution in the second gumming unit is improved, resulting in an inhibition or at least retardation of a viscosity increase of the gum solution of the second gumming unit and of sludge formation in the second gumming unit.

A further preferred embodiment of the present invention provides a method for making a lithographic printing plate from a photopolymer plate precursor, which is perceived by the user as a method which does not require a processing step and wherein the exposed plate can be kept in ambient light for an unlimited time before being mounted on the press, and wherein a visible image is provided before mounting the plate on the press. This can be achieved by adding a colorant to the coating of the photopolymer plate. Since the non-printing areas of the coating are removed in the gumming units, there is no risk of contamination of the fountain solution or ink during the start of the print job.

Other features, elements, steps, characteristics and advantages of the present invention will become more apparent from the following detailed description of preferred embodiments of the present invention.

DETAILED DESCRIPTION OF THE PREFERRED EMBODIMENTS

In accordance with a preferred embodiment of the present invention, a method includes the steps of: a) providing a lithographic printing plate precursor including (i) a support having a hydrophilic surface or which is provided with a hydrophilic layer, (ii) a coating on the support including a photopolymerizable layer and, optionally, an intermediate layer between the photopolymerizable layer and the support, wherein the photopolymerizable layer includes a polymerizable compound, a polymerization initiator, and a binder, b) image-wise exposing the coating in a plate setter, c) optionally, heating the precursor in a pre-heating unit, d) treating the precursor in a gumming station, including a first and at least a second gumming unit, wherein the precursor is consecutively developed in the first and the second gumming units with a gum solution, thereby removing non-exposed areas of the photopolymerizable layer from the support and gumming the plate in a single step.

In a preferred embodiment of the present invention, the printing plate precursor is image-wise exposed off-press by a plate setter, i.e., a laser exposure apparatus suitable for image-wise exposing a precursor. The precursor used in a preferred embodiment of the present invention is negative-working whereby at the exposed areas the coating is hardened. Here, "hardened" means that the coating becomes insoluble or non-dispersible for the gum solution and may be achieved through polymerization and/or crosslinking of the coating.

After imaging, the plate precursor is optionally heated, hereinafter also referred to as "pre-heat" or "pre-heat", to enhance or to speed-up the polymerization and/or crosslinking reaction. This pre-heat step is carried out preferably at a temperature of about 80° C. to 150° C. and preferably for a dwell time of about 5 seconds to 1 minute and preferably in a pre-heating unit provided with heating elements such as IR-lamps, UV-lamps, heated air, heated roll, etc.

Subsequently to the imaging step or the pre-heat step, when a pre-heat step is present, the plate precursor is treated, i.e., developed and gummed, in a gumming station which includes a first and at least a second gumming unit. In these gumming units, a gum solution is applied to the coating of the precursor whereby the non-exposed areas of the photopolymerizable layer are removed from the support and whereby the hydrophilic surface of the support at the non-exposed areas are protected by adsorption of gum in a single step. The precursor is treated with a gum solution firstly in the first gumming unit and subsequently in the second gumming unit. The use of two gumming solutions in two different gumming units has the additional benefit that contamination of the gum solution of the second gumming unit is reduced, whereby an increase of the viscosity of the gum solution of the second gumming unit can be reduced or inhibited and that sludge formation in the second gumming unit is retarded or inhibited. This results in an improved lifetime of the gum solution of the second gumming unit whereby this gum solution, optionally combined with regeneration (e.g., filtering) and/or adding replenishing solution, can be used for developing and gumming a higher number of plates which saves costs and is friendly for the environment.

The development with a gum solution has the additional benefit that, due to the remaining gum on the plate at the non-exposed areas, an additional gumming step is not required to protect the surface of the support at the non-exposed areas. As a result, the precursor is processed and gummed in one single step and the obtained lithographic image on the plate will not be affected by ambient daylight or by contamination.

In the printing step, the plate is mounted on the plate cylinder of the printing press and the printing process is started.

The Gum Solution

A gum solution is typically an aqueous liquid which includes one or more surface protective compounds that are capable of protecting the lithographic image of a printing plate against contamination, e.g., by oxidation, fingerprints, fats, oils or dust, or damaging, e.g., by scratches during handling of the plate. Suitable examples of such compounds are film-forming hydrophilic polymers or surfactants. The layer that remains on the plate after treatment with the gum solution preferably includes between 0.005 and 20 g/m$^2$ of the surface protective compound, more preferably between 0.010 and 10 g/m$^2$, most preferably between 0.020 and 5 g/m$^2$.

In the present description, all concentrations of compounds present in the gum solution are expressed as percentage by weight (wt. % or % w/w) relative to the ready-to-use gum solution, unless otherwise indicated. A gum solution may be normally supplied as a concentrated solution which is diluted by the end user with water to a ready-to-use gum solution before use according to the instructions of the supplier, usually 1 part of the gum is diluted with 1 part to 10 parts of water.

Preferred polymers for use as the protective compound in the gum solution are gum arabic, pullulan, cellulose derivatives such as carboxymethylcellulose, carboxyethylcellulose or methylcellulose, (cyclo)dextrin, poly(vinyl alcohol), poly (vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g., (meth)acrylic acid, vinyl acetate, styrene sulfonic acid, vinyl sulfonic acid, vinyl phosphonic acid, or acrylamidopropane sulfonic acid.

Examples of surfactants for use as the surface protective agent include anionic or nonionic surfactants. The gum solution may also include one or more of the above hydrophilic polymers as the surface protective agent and, in addition, one or more surfactants to improve the surface properties of the coated layer. The surface tension of the gum solution is preferably from 20 to 50 mN/m.

The gum solution includes preferably an anionic surfactant, more preferably an anionic surfactant wherein the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-dinaphtalene-disulfonate, sodium dodecyl-benzenesulfonate, sulfonated alkyl-diphenyloxide, ammonium or potassium perfluoroalkylsulfonate, and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers, and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

According to a preferred embodiment of the present invention, the gum solution has a pH-value preferably between 3 and 9, more preferably between 4.5 and 8.5, most preferably between 5 and 7. The pH of the gum solution is usually adjusted with a mineral acid, an organic acid, or an inorganic salt in an amount of from 0.01 to 15 wt. %, preferably from 0.02 to 10 wt. %. Examples of the mineral acids include nitric acid, sulfuric acid, phosphoric acid, and metaphosphoric acid. Especially, organic acids are used as pH control agents and as desensitizing agents. Examples of the organic acids include carboxylic acids, sulfonic acids, phosphoric acids or salts thereof, e.g., succinates, phosphates, phosphonates, sulfates, and sulfonates. Specific examples of the organic acid include citric acid, acetic acid, oxalic acid, malonic acid, p-toluenesulfonic acid, tartaric acid, malic acid, lactic acid, levulinic acid, phytic acid, and organic phosphonic acid.

The gum solution further includes preferably an inorganic salt. Examples of the inorganic salt include magnesium nitrate, monobasic sodium phosphate, dibasic sodium phosphate, nickel sulfate, sodium hexametaphosphate, and sodium tripolyphosphate. An alkali-metal dihydrogen phosphate such as $KH_2PO_4$ or $NaH_2PO_4$ is most preferred. Other inorganic salts can be used as corrosion inhibiting agents, e.g., magnesium sulfate or zinc nitrate. The mineral acid, organic acid, or inorganic salt may be used singly or in combination with one or more thereof.

In accordance with another preferred embodiment of the present invention, the gum solution as the developer in the processing of the plate includes preferably a mixture of an anionic surfactant and an inorganic salt. In this mixture, the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another preferred embodiment of the present invention, the gum solution including a mixture of an anionic surfactant and an inorganic salt preferably has a pH-value between 3 and 9, more preferably between 4 and 8, most preferably between 5 and 7.

Besides the foregoing components, a wetting agent such as ethylene glycol, propylene glycol, triethylene glycol, butylene glycol, hexylene glycol, diethylene glycol, dipropylene glycol, glycerin, trimethylol propane, and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid, and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosene, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate dioctyl sebacate), epoxidated triglycerides (e.g., epoxy soybean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of, e.g., between 1.7 and 5 mPa·s, by adding viscosity increasing compounds, such as poly(ethylene oxide) or polyvinylalcohol, e.g., having a molecular weight between $10^4$ and $10^7$. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphthalene sulphonic acid, etc. Other gumming solutions contain a hydrophilic polymer component and an organic acid component. Still other baking gumming solutions contain the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant.

Preferred surfactants are non-ionic polyglycols and perfluorated aliphatic polyester acrylates.

In another preferred embodiment, the baking gumming solutions include (a) water, (b) at least one hydrophilic polymer, and (c) at least one component selected from the water soluble organic acids including at least two acid functions and being selected from benzene carboxylic acid, a benzene sulphonic acid, a benzene phosphonic acid, an alkane phosphonic acid and water soluble salts thereof. The mentioned compounds (b) and (c) which are dissolved in the aqueous solution in accordance with a preferred embodiment of the present invention are such that they do not evaporate at the customary baking temperatures. The protective layer which is formed remains water-soluble, even after baking, and can be readily removed without damaging the printing plate. Component (b) includes, in particular, the following hydrophilic polymers: N-polyvinyl-pyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol. Component (c) includes in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphone-pimeic acid), and the sodium salts of these acids. In other preferred embodiments, the baking gumming solution can additionally contain hydroxypolycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates and a natural surfactant (e.g., Saponin). Specific examples of suitable baking gum solutions, ingredients and concentrations thereof, can be found in, e.g., EP-A 222 297, EP-A 1 025 992, DE-A 2 626 473, and U.S. Pat. No. 4,786,581.

The Support

A particularly preferred lithographic support is an electrochemically grained and anodized aluminum support. Graining and anodizing of aluminum supports is well known. The acid used for graining can be, e.g., nitric acid or sulfuric acid. The acid used for graining preferably includes hydrogen chloride. Also, mixtures of, e.g., hydrogen chloride and acetic acid can be used. The relationship between electrochemical graining and anodizing parameters such as electrode voltage, nature, and concentration of the acid electrolyte or power consumption on the one hand and the obtained lithographic quality in terms of Ra and anodic weight (g/m$^2$ of Al$_2$O$_3$ formed on the aluminum surface) on the other hand is well known. More details about the relationship between various production parameters and Ra or anodic weight can be found in, e.g., the article "Management of Change in the Aluminium Printing Industry" by F. R. Mayers, published in the ATB Metallurgie Journal, Vol. 42 No. 1-2, (2002), page 69.

The anodized aluminum support may be subject to a so-called post-anodic treatment to improve the hydrophilic properties of its surface. For example, the aluminum support may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. Another useful post-anodic treatment may be carried out with a solution of polyacrylic acid or a polymer including at least 30 mol % of acrylic acid monomeric units, e.g., GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called 'base layer'. The flexible support is, e.g., paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate, or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in, e.g., EP-A 1 025 992.

The Coating

The coating on the support includes at least one layer including a photopolymerizable composition, the layer hereinafter also referred to as "photopolymerizable layer". On the photopolymerizable layer, an oxygen-barrier layer which includes a water-soluble or water-swellable polymer, can be applied, the barrier layer hereinafter also referred to as "top layer" or "overcoat" or "overcoat layer". The coating may further include an intermediate layer between the photopolymerizable layer and the support.

The thickness of the coating preferably ranges between 0.4 and 10 g/m$^2$, more preferably between 0.5 and 5 g/m$^2$, most preferably between 0.6 and 3 g/m$^2$.

The photopolymerizable layer includes a polymerizable compound, a polymerization initiator capable of hardening the polymerizable compound in the exposed areas, and a binder. The photopolymerizable layer may further include an adhesion promoting compound.

The photopolymerizable layer has a coating thickness preferably ranging between 0.4 and 5.0 g/m$^2$, more preferably between 0.5 and 3.0 g/m$^2$, most preferably between 0.6 and 2.2 g/m$^2$.

The Adhesion Promoting Compound

The adhesion promoting compound is a compound capable of interacting with the support, preferably a compound having an addition-polymerizable ethylenically unsaturated bond and a functional group capable of interacting with the support, more preferably a functional group capable of interacting with a grained and anodized aluminum support. By "interacting" it is understood each type of physical and/or chemical reaction or process whereby, between the functional group and the support, a bond is formed which can be a covalent bond, an ionic bond, a complex bond, a coordinate bond, or a hydrogen-bridge bond, and which can be formed by an adsorption process, a chemical reaction, an acid-base reaction, a complex-forming reaction, or a reaction of a chelating group or a ligand. The adhesion promoting compound may be present in the photopolymerizable layer and/or in an intermediate layer between the photopolymerizable layer and the support.

The adhesion promoting compound may be selected from at least one of the low molecular weight compounds or polymeric compounds as described in EP-A 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19. Preferred compounds are those compounds which include a phosphate or phosphonate group as the functional group capable of adsorbing on the aluminum support and which include an addition-polymerizable ethylenic double bond reactive group, especially those described in EP-A 851 299 from lines 22 on page 3 to line 1 on page 4 and EP-A 1 500 498 from paragraph [0023] on page 7 to paragraph [0052] on page 20. Also preferred are those compounds which include trialkyl-oxy silane groups, hereinafter also referred to as "trialkoxy silane" groups, wherein the alkyl is preferably methyl or ethyl, or wherein the trialkyloxy silane groups are at least partially hydrolysed to silanol groups, as the functional group capable of adsorbing on the support, especially silane coupling agents having an addition-polymerizable ethylenic double bond reactive group as described in EP-A 1 557 262 paragraph [0279] on page 49 and EP-A 1 495 866 paragraph [0030] on page 5 to paragraph [0049] on page 11.

The adhesion promoting compound may be present in the photopolymerizable layer in an amount ranging between 1 and 50 wt %, preferably between 3 and 30 wt %, more preferably between 5 and 20 wt % of the non-volatile components of the composition.

The adhesion promoting compound may be present in the intermediate layer in an amount of at least 50 wt %, preferably at least 80 wt %, more preferably at least 90 wt %, most preferably 100 wt % of the non-volatile components of the composition.

The optional intermediate layer has a coating thickness preferably ranging between 0.001 and 1.5 g/m$^2$, more preferably between 0.003 and 1.0 g/m$^2$, most preferably between 0.005 and 0.7 g/m$^2$.

The Polymerizable Compound and the Polymerization Initiator

According to one preferred embodiment of the present invention, the polymerizable monomer or oligomer is a monomer or oligomer including at least one epoxy or vinyl ether functional group and the initiator is a Bronsted acid generator capable of generating a free acid, optionally in the presence of a sensitizer, upon exposure, hereinafter the initiator also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol Aepichlorohydrin epoxy resin and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating a Bronsted acid, they also generate free radicals during photo or thermal decomposition.

According to a more preferred embodiment of the present invention, the polymerizable monomer or oligomer is a ethylenically unsaturated compound, having at least one terminal ethylenic group, hereinafter also referred to as "free-radical polymerizable monomer", and the initiator is a compound, capable of generating a free radical, optionally in the presence of a sensitizer, upon exposure, hereinafter the initiator also referred to as "free radical initiator".

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth) acrylate group. The (meth)acrylate monomers may also contain an acidic (such as carboxylic acid) or basic (such as amine) functionality.

Any free radical initiator capable of generating a free radical directly or in the presence of a sensitizer upon exposure can be used as a free radical initiator. Suitable free-radical initiators include, for example, the derivatives of acetophenone (such as 2,2-dimethoxy-2-phenylacetophenone, and 2-methyl-l-[4-(methylthio) phenyll-2-morpholino propan-l-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076); haloalkyl substituted s-triazines (such as 2,4-bis(trichloromethyl)-6-(p-methoxy-styryl)-s-triazine, 2,4-bis(trichloromethyl)-6-(4-methoxy-naphth-l-yl)-s-triazine, 2,4-bis(trichloromethyl)-6-piperonyl-s-triazine, and 2,4-bis(trichloromethyl)-6-[(4-ethoxy-ethylenoxy)-phen-1-yl]-s-triazine, and s-triazines as described in U.S. Pat. Nos. 5,955,238, 6,037,098, 6,010,824, and 5,629,354); and titanocene (bis(etha.9-2,4-cyclopentadien-1-yl) bis[2,6-difluoro-3-(lH-pyrrol-1-yl)phenyl] titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines.

Known photopolymerization initiators can be used in the composition of the preferred embodiments of the present invention. In a preferred embodiment of the present invention, the photopolymerizable composition includes a hexaaryl-bisimidazole (HABI; dimer of triaryl-imidazole) compound as a photopolymerization initiator alone or in combination with further photoinitiators.

A procedure for the preparation of hexaarylbisimidazoles is described in DE 1470 154 and their use in photopolymerizable compositions is documented in EP 24 629, EP 107 792, U.S. Pat. No. 4,410,621, EP 215 453, and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl)-bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole, and 2,2'-bis(2,6-difluorophenyl)-4,5,4',5'-tetraphenylbisimidazole. The amount of the HABI photoinitiator typically ranges from 0.01 to 30% by weight, preferably from 0.5 to 20% by weight, relative to the total weight of the non volatile components of the photopolymerizable composition.

A very high sensitivity can be obtained in the context of a preferred embodiment of the present invention by the combination of an optical brightener as the sensitizer and a hexaarylbisimidazole as the photoinitiator.

Suitable classes of photoinitiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition includes a non-boron including photopolymerization initiator and particularly preferred the photopolymerization initiator includes no boron compound. Many specific examples of photoinitiators suitable for the present invention can be found in EP-A 1 091 247. Other preferred initiators are trihalo methyl sulphones.

Preferably hexaarylbisimidazole compounds and/or metallocene compounds are used alone or in combination with other suitable photoinitiators, in particular with aromatic ketones, aromatic onium salts, organic peroxides, thio compounds, ketoxime ester compounds, azinium compounds, active ester compounds, or compounds having a carbon halogen bond.

In a preferred embodiment of the present invention, the hexaarylbisimidazole compounds make more than 50 mol-%, preferably at least 80 mol-% and particularly preferred at least 90 mol-% of all the photoinitiators used in the photopolymerizable composition.

According to another preferred embodiment of the present invention, the polymerizable monomer or oligomer may be a combination of a monomer or oligomer including at least one epoxy or vinyl ether functional group and a polymerizable ethylenically unsaturated compound, having at least one terminal ethylenic group, and the initiator may be a combination of a cationic initiator and a free-radical initiator. A monomer or oligomer including at least one epoxy or vinyl ether functional group and a polymerizable ethylenically unsaturated compound, having at least one terminal ethylenic group, can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both a free radical and a free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both a free radical and a free acid in the presence of a sensitizer.

The photopolymerizable layer may also include a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049,479, EP 1079276, EP 1369232, EP 1369231, EP 1341040, U.S. 2003/0124460, EP 1241002, EP 1288720, and in the reference book including the cited references: Chemistry & Technology UV & EB Formulation for Coatings, Inks & Paints, Volume 2, Prepolymers and Reactive Diluents for UV and EB Curable Formulations by N. S. Allen, M. A. Johnson, P. K. T. Oldring, M. S. Salim, Edited by P. K. T. Oldring, 1991, ISBN 0 947798102. Particularly preferred are urethane (meth)acrylate multifunctional monomers, which can be used alone or in combination with other (meth)acrylate multifunctional monomers.

The photopolymerizable layer may also include a co-initiator. Typically, a co-initiator is used in combination with a free radical initiator and/or cationic initiator. Particular co-initiators for use in the photopolymer coating are disclosed in U.S. Pat. No. 6,410,205, U.S. Pat. No. 5,049,479, EP 1079276, EP 1369232, EP 1369231, EP 1341040, U.S. 2003/0124460, EP 1241002, EP 1288720, and in the reference book including the cited references: Chemistry & Technology UV & EB Formulation for Coatings, Inks & Paints, Volume 3, Photoinitiators for Free Radical and Cationic Polymerisation by K. K. Dietliker, Edited by P. K. T. Oldring, 1991, ISBN 0 947798161.

The photopolymerizable layer may also include an inhibitor. Particular inhibitors for use in the photopolymer coating are disclosed in U.S. Pat. No. 6,410,205, EP 1288720, and WO 2005/109103.

The Binder of the Photopolymerizable Layer

The photopolymerizable layer may also include a binder. The binder can be selected from a wide series of organic polymers. Compositions of different binders can also be used. Useful binders include for example chlorinated polyalkylene (in particular chlorinated polyethylene and chlorinated polypropylene), polymethacrylic acid alkyl esters or alkenyl esters (in particular polymethyl (meth)acrylate, polyethyl (meth)acrylate, polybutyl (meth)acrylate, polyisobutyl (meth)acrylate, polyhexyl (meth)acrylate, poly(2-ethylhexyl) (meth)acrylate and polyalkyl (meth)acrylate copolymers of (meth) acrylic acid alkyl esters or alkenyl esters with other copolymerizable monomers (in particular with (met) acrylonitrile, vinyl chloride, vinylidene chloride, styrene and/or butadiene), polyvinyl chloride (PVC, vinylchloride/(meth) acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly (meth)acrylonitrile, (meth)acrylonitrile/styrene copolymers, (meth)acrylamide/alkyl (meth)acrylate copolymers, (meth)acrylonitrile/butadiene/styrene (ABS) terpolymers, polystyrene, poly(α-methylstyrene), polyamides, polyurethanes, polyesters, methyl cellulose, ethylcellulose, acetyl cellulose, hydroxy-($C_1$-$C_4$-alkyl)cellulose, carboxymethyl cellulose, polyvinyl formal, and polyvinyl butyral. Particularly preferred binders are polymers having vinylcaprolactam, vinylpyrrolidone, or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from $C_4$ to $C_{30}$. Other useful binders are binders containing carboxyl groups, in particular copolymers containing monomeric units of α,β-unsaturated carboxylic acids or monomeric units of α,β-unsaturated dicarboxylic acids (preferably acrylic acid, methacrylic acid, crotonic acid, vinylacetic acid, maleic acid or itaconic acid). The term "copolymers" is to be understood in the context of the preferred embodiments of the present invention as polymers containing units of at least 2 different monomers, thus also terpolymers and higher mixed polymers. Particular examples of useful copolymers are those containing units of (meth)acrylic acid and units of alkyl (meth)acrylates, allyl (meth)acrylates and/or (meth)acrylonitrile as well as copolymers containing units of crotonic acid and units of alkyl (meth)acrylates and/or (meth)acrylonitrile and vinylacetic acid/alkyl (meth)acrylate copolymers. Also suitable are copolymers containing units of maleic anhydride or maleic acid monoalkyl esters. Among these are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl (meth)acrylates, allyl alcohol, hydroxystyrene or vinyl alcohol, as well as epoxy resins, provided they carry a sufficient number of free OH groups. Particularly useful binders and particularly useful reactive binders are disclosed in EP 1 369 232, EP 1 369 231, EP 1 341 040, U.S. 2003/0124460, EP 1 241 002, EP 1 288 720, U.S. Pat. No. 6,027,857, U.S. Pat. No. 6,171,735, and U.S. Pat. No. 6,420,089.

The organic polymers used as binders have a typical mean molecular weight $M_w$ between 600 and 700,000, preferably between 1,000 and 350,000. Preference is further given to polymers having an acid number between 10 to 250, preferably 20 to 200, or a hydroxyl number between 50 and 750, preferably between 100 and 500. The amount of binder(s) generally ranges from 10 to 90% by weight, preferably 20 to 80% by weight, relative to the total weight of the non-volatile components of the composition.

Also, particularly suitable binders are copolymers of vinylacetate and vinylalcohol, preferably including vinylalcohol in an amount of 10 to 98 mol % vinylalcohol, more preferably between 35 and 95 mol %, most preferably 40 and 75 mol %, best results are obtained with 50 to 65 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4 weight % aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight $M_W$ of the copolymers of vinylacetate and vinylalcohol ranges preferably between 5,000 and 500,000 g/mol, more preferably between 10,000 and 400,000 g/mol, most preferably between 15,000 and 250,000 g/mol. Other preferred binders are disclosed in EP 152 819 B1 on page 2, lines 50-page 4, line 20, and in EP 1 043 627 B1 on paragraph [0013] on page 3.

In another preferred embodiment, the polymeric binder includes a hydrophobic backbone, and pendant groups including for example a hydrophilic poly(alkylene oxide) segment. The polymeric binder may also include pendant cyano groups attached to the hydrophobic backbone. A combination of such binders may also be employed. Generally the polymeric binder is a solid at room temperature, and is typically a non-elastomeric thermoplastic. The polymeric binder includes both hydrophilic and hydrophobic regions, which is thought to be important for enhancing differentiation of the exposed and unexposed areas by facilitating developability. Generally the polymeric binder is characterized by a number average molecular weight (Mn) in the range from about 10,000 to 250,000, more commonly in the range from about 25,000 to 200,000. The polymerizable composition may include discrete particles of the polymeric binder. Preferably the discrete particles are particles of the polymeric binder which are suspended in the polymerizable composition. The presence of discrete particles tends to promote developability of the unexposed areas. Specific examples of the polymeric binders according to this preferred embodiment are described in U.S. Pat. No. 6,899,994, U.S. 2004/0260050, U.S. 2005/0003285, U.S. 2005/0170286, and U.S. 2005/0123853. In addition to the polymeric binder, the imagable layer may optionally include one or more co-binders. Typical co-binders are water-soluble or water-dispersible polymers, such as, cellulose derivatives, poly vinyl alcohol, poly acrylic acid poly(meth)acrylic acid, poly vinyl pyrrolidone, polylactide, poly vinyl phosphonic acid, synthetic co-polymers, such as the co-polymer of an alkoxy polyethylene glycol (meth)acrylate. Specific examples of co-binders are described in U.S. 2004/0260050, U.S. 2005/0003285, and U.S. 2005/0123853. Printing plate precursors, the imagable layer of which includes a binder and optionally a co-binder according this preferred embodiment and described in more detail in U.S. 2004/0260050, U.S. 2005/0003285, and U.S. 2005/0123853, optionally include a top coat and an interlayer.

Surfactant

Various surfactants may be added into the photopolymerizable layer to allow or enhance the developability of the precursor with a gum solution. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

Sensitizer

The photocurable composition may also include a sensitizer. Highly preferred sensitizers are violet light absorbing sensitizers, having an absorption spectrum between 350 nm and 450 nm, preferably between 370 nm and 420 nm, more preferably between 390 nm and 415 nm. Particularly preferred sensitizers are disclosed in EP 1 349 006 paragraphs [0007] to [0009], WO 2005/029187, and WO2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particularly preferred sensitizers are heptamethinecyane dyes, especially the dyes disclosed in EP 1 359 008 paragraphs [0030] to [0032]. Other preferred sensitizers are blue, green, or red light absorbing sensitizers, having an absorption spectrum between 450 nm and 750 nm. Useful sensitizers can be selected from the sensitizing dyes disclosed in U.S. Pat. No. 6,410,205, U.S. Pat. No. 5,049,479, EP 1 079 276, EP 1 369 232, EP 1 369 231, EP 1 341 040, U.S. 2003/0124460, EP 1 241 002, and EP 1 288 720.

Colorant

The photopolymerizable layer or another layer of the coating may also include a colorant. The colorant can be present in the photopolymerizable layer or in a separate layer below or above the photopolymerizable layer. After processing with a gum solution, at least a portion of the colorant remains on the hardened coating areas, and a visible image can be produced on the support by removing the coating, including the colorant, at the non-exposed areas in the gum processing.

The colorant can be a dye or a pigment. A dye or pigment can be used as the colorant when the layer, including the dye or pigment, is colored for the human eye.

The colorant can be a pigment. Various types of pigments can be used such as organic pigments, inorganic pigments, carbon black, metallic powder pigments, and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples of pigments usable as the colorant are the following (herein is C.I. an abbreviation for Color Index; by a Blue colored pigment it is understood a pigment that appears blue to the human eye; the other colored pigments have to be understood in an analogous way):

Blue colored pigments which include C.I. Pigment Blue 1, C.I. Pigment Blue 2, C.I. Pigment Blue 3, C.I. Pigment Blue 15:3, C.I. Pigment Blue 15:4, C.I. Pigment Blue 15:34, C.I. Pigment Blue 16, C.I. Pigment Blue 22, C.I. Pigment Blue 60 and the like; and C.I. Vat Blue 4, C.I. Vat Blue 60 and the like;

Red colored pigments which include C.I. Pigment Red 5, C.I. Pigment Red 7, C.I. Pigment Red 12, C.I. Pigment Red 48 (Ca), C.I. Pigment Red 48 (Mn), C.I. Pigment Red 57 (Ca), C.I. Pigment Red 57:1, C.I. Pigment Red 112, C.I. Pigment Red 122, C.I. Pigment Red 123, C.I. Pigment Red 168, C.I. Pigment Red 184, C.I. Pigment Red 202, and C.I. Pigment Red 209;

Yellow colored pigments which include C.I. Pigment Yellow 1, C.I. Pigment Yellow 2, C.I. Pigment Yellow 3, C.I. Pigment Yellow 12, C.I. Pigment Yellow 13, C.I. Pigment Yellow 14C, C.I. Pigment Yellow 16, C.I. Pigment Yellow 17, C.I. Pigment Yellow 73, C.I. Pigment Yellow 74, C.I. Pigment Yellow 75, C.I. Pigment Yellow 83, C.I. Pigment Yellow 93, C.I. Pigment Yellow 95, C.I. Pigment Yellow 97, C.I. Pigment Yellow 98, C.I. Pigment Yellow 109, C.I. Pigment Yellow 110, C.I. Pigment Yellow 114, C.I. Pigment Yellow 128, C.I. Pigment Yellow 129, C.I. Pigment Yellow 138, C.I. Pigment Yellow 150, C.I. Pigment Yellow 151, C.I. Pigment Yellow 154, C.I. Pigment Yellow 155, C.I. Pigment Yellow 180, and C.I. Pigment Yellow 185;

Orange colored pigments include C.I. Pigment Orange 36, C.I. Pigment Orange 43, and a mixture of these pigments;

Green colored pigments include C.I. Pigment Green 7, C.I. Pigment Green 36, and a mixture of these pigments;

Black colored pigments include: those manufactured by Mitsubishi Chemical Corporation, for example, No. 2300, No. 900, MCF 88, No. 33, No. 40, No. 45, No. 52, MA 7, MA 8, MA 100, and No. 2200 B; those manufactured by Columbian Carbon Co., Ltd., for example, Raven 5750, Raven 5250, Raven 5000, Raven 3500, Raven 1255, and Raven 700; those manufactured by Cabot Corporation, for example, Regal 400 R, Regal 330 R, Regal 660 R, Mogul L, Monarch 700, Monarch 800, Monarch 880, Monarch 900, Monarch 1000, Monarch 1100, Monarch 1300, and Monarch 1400; and those manufactured by Degussa, for example, Color Black FW 1, Color Black FW 2, Color Black FW 2 V, Color Black FW 18, Color Black FW 200, Color Black S 150, Color Black S 160, Color Black S 170, Printex 35, Printex U, Printex V, Printex 140 U, Special Black 6, Special Black 5, Special Black 4A, and Special Black 4.

Other types of pigments such as brown pigments, violet pigments, fluorescent pigments, and metallic powder pigments can also be used as the colorant. The pigments may be used alone or as a mixture of two or more pigments as the colorant.

Blue colored pigments, including cyan pigments, are preferred.

The pigments may be used with or without being subjected to a surface treatment of the pigment particles. Preferably, the pigments are subjected to a surface treatment. Methods for the surface treatment include methods of applying a surface coat of resin, methods of applying surfactant, and methods of bonding a reactive material (for example, a silane coupling agent, an epoxy compound, polyisocyanate, or the like) to the surface of the pigment. Suitable examples of pigments with a surface treatment are the modified pigments described in WO 02/04210. Specifically, the blue colored modified pigments described in WO 02/04210 are preferred as the colorant in a preferred embodiment of the present invention.

The pigments have a particle size which is preferably less than 10 μm, more preferably less than 5 μm and especially preferably less than 3 μm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill, and a press kneader. Details thereof are described in "Latest Pigment Applied Technology" (CMC Publications, published in 1986).

A dispersing agent may be omitted in the preparation of dispersions of so-called self-dispersing pigments. Specific examples of self-dispersing pigments are pigments which are subjected to a surface treatment in such a way the pigment surface is compatible with the dispersing liquid. Typical examples of self-dispersing pigments in an aqueous medium are pigments which have ionic or ionizable groups or polyethyleneoxide chains coupled to the particle-surface. Examples of ionic or ionizable groups are acid groups or salts thereof such as carboxylic acid group, sulphonic acid, phosphoric acid, or phosphoric acid and alkali metal salts of these acids. Suitable examples of self-dispersing pigments are described in WO 02/04210 and these are preferred in the present invention. The blue colored self-dispersing pigments in WO 02/04210 are preferred.

Typically, the amount of pigment in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as colorant in the photopolymerizable coating. Specific examples thereof include azo dyes, metal complex salt azo dyes, pyrazolone azo dyes, anthraquinone dyes, phthalacyanine dyes, carbionium dyes, quinonimine dyes, methine dyes, and the like. Phthalocyanine dyes are preferred. Suitable dyes are salt-forming organic dyes and may be selected from oil-soluble dyes and basic dyes. Specific examples thereof are (herein is CI an abbreviation for Color Index): Oil Yellow 101, Oil Yellow 103, Oil Pink 312, Oil Green BG, Oil Blue GOS, Oil Blue 603, Oil Black BY, Oil Black BS, Oil Black T-505, Victoria Pure Blue, Crystal Violet (CI42555), Methyl Violet (CI42535), Ethyl Violet, Rhodamine B (CI415170B), Malachite Green (CI42000), Methylene Blue (CI52015). Also, the dyes disclosed in GB 2 192 729 may be used as the colorant.

Typically, the amount of dye in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

Printing-Out Agent

The photopolymerizable layer or another layer of the coating may also include a printing-out agent, i.e., a compound which is capable of changing the color of the coating upon exposure. After image-wise exposing the precursor, a visible image can be produced, hereinafter also referred to as "print-out image". The printing-out agent may be a compound as described in EP-A-1 491 356 paragraphs [0116] to [0119] on page 19 and 20, and in U.S. 2005/008971 paragraphs [0168] to [0172] on page 17. Preferred printing-out agents are the compounds described in WO 2006/005688, from line 1, page 9 to line 27, page 20. More preferred are the IR-dyes as described in the unpublished Patent Application EP 05 105 440.1, filed on 21 Jun. 2005, from line 32, page 5 to line 9, page 32.

The Contrast

The contrast of the image formed after image-wise exposure and processing with a gum solution is defined as the difference between the optical density at the exposed area to the optical density at the non-exposed area, and this contrast is preferably as high as possible. This enables the end-user to establish immediately whether or not the precursor has already been exposed and processed with a gum solution, to distinguish the different color selections and to inspect the quality of the image on the treated plate precursor.

The contrast increases with increasing optical density in the exposed area and/or decreasing optical density in the non-exposed areas. The optical density in the exposed area may increase with the amount and extinction coefficient of the colorant remaining in the exposed areas and the intensity of color formed by the printing-out agent. In the non-exposed areas, it is preferred that the amount of the colorant is as low as possible and that the intensity of color print-out agent is as low as possible. The optical density can be measured in reflectance by an optical densitometer, equipped with several filters (e.g., cyan, magenta, yellow). The difference in optical density at the exposed area and the non-exposed area preferably has a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e., by blue color it is understood a color that appears blue to the human eye.

The Top Layer

The coating may include a top layer which acts as an oxygen barrier layer, hereinafter also referred to as "overcoat layer" or "overcoat". Preferred binders which can be used in the top layer are polyvinyl alcohol and the polymers disclosed in WO 2005/029190, U.S. Pat. No. 6,410,205, and EP 1 288 720, including the cited references in these patents and patent applications. The most preferred binder for the top layer is polyvinylalcohol. The polyvinylalcohol preferably has a hydrolysis degree ranging between 74 mol % and 99 mol %. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

The coating thickness of the top layer is preferably between 0.25 and 1.75 $g/m^2$, more preferably between 0.25 and 1.3 $g/m^2$, most preferably between 0.25 and 1.0 $g/m^2$. In a more preferred embodiment of the present invention, the top layer has a coating thickness between 0.25 and 1.75 $g/m^2$ and includes a polyvinylalcohol having a hydrolysis degree ranging between 74 mol % and 99 mol % and a viscosity number as defined above ranging between 3 and 26.

In a preferred embodiment, the composition and the thickness of the top layer are optimized in order to obtain a high sensitivity, good daylight stability and less or no sludge formation during processing. In order to reduce sludge, the top layer includes less polyvinylalcohol and polyvinylalcohol with a lower molecular weight, preferably a viscosity number of less than 26, more preferably less than 10 is used and a thickness as low as possible but more than 0.25 $g/m^2$. In order to improve the sensitivity, a good oxygen barrier is desired, using a polyvinylalcohol with a high hydrolysis degree, preferably 88-98%, and a bigger thickness of the top layer. In order to improve the daylight stability, small penetration of oxygen is desired by a using an oxygen barrier with a reduced barrier property for oxygen, preferably by using a smaller thickness of the top layer and with polyvinylalcohol having a lower hydrolysis degree. Due to a good balance of these elements, an optimized property for the precursor can be obtained.

The top layer may also include a component selected from the compounds of the gum solution as described above.

Exposure

The image-wise exposing step is carried out off-press in a plate setter, i.e., an exposure apparatus suitable for image-wise exposing the precursor by a laser such as a laser diode, emitting around 830 nm, a NdYAG laser, emitting around 1060 nm, a violet laser, emitting around 400 nm, or a gas laser such as Ar laser, or by a digital modulated UV-exposure, e.g., by digital mirror devices, or by a conventional exposure in contact with a mask. In a preferred embodiment of the present invention, the precursor is image-wise exposed by a laser emitting IR-light or violet light.

Pre-Heating

After this image-wise exposing step, the precursor may be pre-heated in a pre-heating unit, preferably at a temperature of about 80° C. to 150° C. and preferably for a dwell time of about 5 seconds to 1 minute. This pre-heating unit may include a heating element, preferably an IR-lamp, an UV-lamp, heated air, or a heated roll.

In another preferred embodiment of the present invention, the precursor is not pre-heated after the image-wise exposing step.

Treating Step in Gumming Station

After the image-wise exposing step or, when a pre-heating step is present, after the pre-heating step, the precursor is treated, i.e., developed and gummed, with a gum solution in a gumming station which includes a first and at least a second gumming unit, optionally a first, a second, and a third gumming unit. The precursor is firstly treated in the first gumming unit, subsequently in the second gumming unit and, when a third gumming unit is present, finally in the third gumming unit, whereby the non-exposed areas of the photopolymerizable layer are removed from the support and whereby the plate is gummed in a single step, hereinafter also referred to as "developing step" or "developing" or "gum processing".

In each of the gumming units, the gum solution is applied to the coating of the precursor by a spraying, jetting, dipping, or coating technique, including spin coating, roll coating, slot coating, or gravure coating, or by rubbing in with an impregnated pad or by pouring-in, either by hand or in an automatic apparatus. The spraying, jetting, dipping, or coating techniques are preferred.

An example of a spray nozzle which can be used in the spraying technique is an air assisted spray nozzle of the type SUJ1, commercially available at Spraying Systems Belgium, Brussels. The spray nozzle may be mounted at a distance of 50 mm to 200 mm between the nozzle and receiving substrate. The flow rate of the spray solution may be set to 7 ml/min. During the spray process an air pressure in the range of $4.80 \times 10^5$ Pa may be used on the spray head. This layer may be dried during the spraying process and/or after the spraying process. Typical examples of jet nozzles which can be used in the jetting technique are ink-jet nozzles and valve-jet nozzles.

At least one of the gumming units may be provided with at least one roller for rubbing and/or brushing the coating while applying the gum solution to the coating. The gum solutions used in the developing step preferably have a temperature ranging between 15° C. and 85° C., more preferably between 18° C. and 65° C., most preferably between 20° C. and 55° C. Each of the gumming units may be provided with a tank wherein the gum solution is present: the first gumming unit may include a first tank, the second gumming unit may include a second tank, and optionally the third gumming unit may also include a third tank. The gum solution used to treat the precursor can be collected in a tank and can be used several times to treat the precursor. To the gum solution, present in each tank, a replenishing solution can be added. In a particularly preferred embodiment, the gum solution in the second gumming unit or, when a third gumming unit is present, in the third gumming unit may be used once-only, i.e., only starting gum solution is used to treat the precursor in this gumming unit by preferably a spraying or jetting technique.

The replenishing solution is a solution which may be selected from a starting gum solution, a concentrated gum solution, a diluted gum solution, a solution of a non-ionic surfactant, water, a solution of a buffer having a pH ranging between 4 and 7 or a baking gum. A concentrated or diluted gum solution is a solution including a higher, or respectively, lower concentration of gum additives as defined above. A concentrated gum solution can be added as a replenishing solution when the concentration of active products is under a desired level in the gum solution. A diluted gum solution or water can be used when the concentration of active products is above a desired level in the gum solution or when the viscosity of the gum solution is increased or when the volume of the gum solution is under a desired level, e.g., due to evaporation of solvent or water. A solution of a non-ionic surfactant or a solution of a buffer can be added when the gum solution needs a higher concentration of a surfactant or when the pH of the gum solution needs to be controlled at a desired pH value or at a desired pH value in a range of two pH values, e.g., between 4 and 7.

The addition of replenishing solution, i.e., the type and the amount of replenishing solution, may be regulated by the measurement of at least one of the following parameters such as the number and area of plate precursor developed, the time period of developing, the volume in each gumming unit (minimum and maximum level), the viscosity (or viscosity increase) of the gum solution, the pH (or pH change) of the gum solution, the density (or density increase) of the gum solution and the conductivity (or conductivity increase) of the gum solution, or a combination of at least two of them. The density (or density increase) of the gum solution can be measured with a PAAR density meter.

Optionally, the same or another replenishing solution can be further added to the one and the same gumming unit or to different gumming units, e.g., a diluted gum solution, a solution of a non-ionic surfactant or water. In another option, two different replenishing solutions can also be added to one gumming unit, e.g., a starting gum solution and water.

In a preferred embodiment of the present invention, the gumming station, including the first and second gumming unit, has the configuration of a cascade system, i.e., the gum solution, used in the second gumming unit and present in the second tank, overflows from the second tank to the first tank when gum replenishing solution is added in the second gumming unit or when the gum solution in the second gumming unit is used once-only, i.e., only starting gum solution is used to develop the precursor in this second gumming unit by preferably a spraying or jetting technique. In this configuration, the used gum solution of this second gumming unit is collected in second tank and overflows to the first tank or is collected in the first tank. The gum solution in this first tank can be used several times to treat the precursor in the first gumming unit.

In another preferred embodiment of the present invention, the gumming station, including the first, second, and third gumming unit, has the configuration of a cascade system, i.e., the gum solution, used in the third gumming unit and present in the third tank, overflows from the third tank to the second tank and, further, from the second tank to the first tank when gum replenishing solution is added in the third gumming unit or when the gum solution in the third gumming unit is used once-only, i.e., only starting gum solution is used to develop the precursor in this third gumming unit by preferably a spraying or jetting technique. In this configuration, the used gum solution of this third gumming unit is collected in the third tank and overflows to the second tank or is collected in the second tank. The gum solution in this second and first tank can be used several times to treat the precursor respectively in the second and first gumming unit. Optionally, the same or a different replenishing solution may be further added to the second gumming unit and/or to the first gumming unit.

In another preferred embodiment of the present invention, the precursor is treated in the first gumming unit with the gum solution used in second gumming unit, and the precursor is further treated in the second gumming unit with the gum solution used in the third gumming unit, and the precursor is further treated in the third gumming unit with starting gum solution by preferably a spraying or jetting technique. The starting gum solution is a gum solution which has not been used before for treating a precursor and has the same composition as the gum solution at starting the process.

In another preferred embodiment of the present invention, the gum solution used in each of the gumming units may be also regenerated by removing insoluble material present in the gum solution. The presence of insoluble material in the gum solution may caused by several reasons, e.g., by removing a pigment containing coating, by evaporation of solvent or water, or by sedimentation, coagulation, or flocculation of components in the gum solution. The insoluble material can be removed by several techniques such as filtration, ultra-filtration, centrifugation, or decantation. A suitable apparatus for disposing a waste solution such as the gum solution of the preferred embodiments of the present invention is described in EP-A 747 773. The apparatus can be connected to the tank of a gumming unit to regenerate the used gum solution by circulation of the gum solution over a filter or a filter membrane. The gum solution can be circulated over the filter or filter membrane continuously, periodically, or during the treating time, or the circulation is regulated by the measurement of the turbidity or transparency (i.e., optical transmission) of the gum solution whereby the circulation starts when the turbidity exceeds an upper value and stops when an under value is reached. The upper and under turbidity value can be chosen in relation to the desired degree of purification.

Drying

According to another preferred embodiment of the present invention, the plate can be dried after the gum-processing step in a drying unit. In a preferred embodiment, the plate is dried by heating the plate in the drying unit which may contain at least one heating element selected from an IR-lamp, an UV-lamp, a heated metal roller, or heated air. In a preferred embodiment of the present invention, the plate is dried with heated air as known in the drying section of a conventional developing machine.

Baking

According to another preferred embodiment of the present invention, the plate can be heated in a baking unit, optionally after drying the plate. In a preferred embodiment of the present invention, when the plate is heated in a baking unit, the precursor is developed by using a baking gum and the gum solution is preferably replenished by adding a replenishing baking gum. The replenishing baking gum is a solution which may be selected from a starting baking gum, i.e., a solution having the same composition as the baking gum used at the start of the development, a concentrated baking gum or a diluted baking gum, i.e., a solution having a higher, or respectively, lower concentration of additives than the starting baking gum, and water.

The baking unit may contain at least one heating element selected from an IR-lamp, a UV-lamp, a heated metal roller, or heated air. The plate is preferably heated in the baking unit at a temperature above 150° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes.

In a preferred embodiment of the present invention, the plate is heated by the method as described in EP-A 1 506 854. In another preferred embodiment of the present invention, the plate is heated by the method as described in WO 2005/015318.

In another preferred embodiment of the present invention, the drying step and the heating step may be combined in one single step wherein the plate, after the gum-developing step, is dried and heated in an integrated drying-baking station.

Single Apparatus

According to another preferred embodiment of the present invention, the first gumming unit and the second gumming unit are coupled together by a mechanical plate conveying device. The first gumming unit may be further coupled by a mechanical plate conveying device to the pre-heating unit. The second gumming unit may be further coupled by a mechanical plate conveying device to the drying unit. The drying station may be further coupled by a mechanical plate conveying device to the baking unit. The second gumming unit may also be further coupled by a mechanical plate conveying device to the integrated drying-baking unit.

According to still another preferred embodiment of the present invention, the pre-heating unit, coupled to the first gumming unit, may be further coupled to the plate setter by a mechanical plate conveying device wherein the precursor is shielded from ambient light.

EXAMPLES

Preparation of Aluminum Support S-1

A 0.3 mm thick aluminum foil was degreased by spraying with an aqueous solution containing 26 g/l of NaOH at 65° C. for 2 seconds and rinsed with demineralized water for 1.5 seconds. The foil was then electrochemically grained for 10 seconds using an alternating current in an aqueous solution containing 15 g/l of HCl, 15 g/l of $SO_4^{2-}$ ions and 5 g/l of $Al^{3+}$ ions at a temperature of 37° C. and a current density of about 100 A/dm$^2$. The aluminum foil was then desmutted by etching with an aqueous solution containing 5.5 g/l of NaOH at 36° C. for 2 seconds and rinsed with demineralized water for 2 seconds. The foil was subsequently subjected to anodic oxidation for 15 seconds in an aqueous solution containing 145 g/l of sulfuric acid at a temperature of 50° C. and a current density of 17 A/dm$^2$, then washed with demineralized water for 11 seconds and post-treated for 3 seconds by spraying a solution containing 2.2 g/l of polyvinylphosphonic acid at 70° C., rinsed with demineralized water for 1 second and dried at 120° C. for 5 seconds.

The support thus obtained was characterized by a surface roughness Ra of 0.35-0.4 µm, measured with interferometer NT1100, and had an anodic weight of 3.0 g/m$^2$.

Preparation of Photosensitive Layer P-1:

The coating compositions for the photosensitive layer P-1 were prepared by mixing the ingredients as specified in Table 2. The resulting solution was coated on a support. After coating, the plate was dried for 1 minute at 120° C. in a circulation oven. The resulting applied amount is 1.20 g/m$^2$.

TABLE 2

Compositions of the Photosensitive Layer Solutions

| COMPOSITION/ INGREDIENTS | P-1 |
|---|---|
| Koma 30 (1) (g) | 138.20 |
| FST 426R (2) (g) | 8.82 |
| Mono Z1620 (3) (g) | 93.13 |
| Heliogene Blue D7490 (4) (g) | 55.97 |
| DISB (5) (g) | 2.92 |
| HABI (6) (g) | 4.42 |
| MBT (7) (g) | 0.20 |
| Hostanox 03 (8) (g) | 0.34 |
| Edaplan LA411 (9) (g) | 0.68 |
| Dowanol PM (10) (g) | 526.39 |
| Butanone (g) | 168.92 |

(1) Koma 30 is a copolymer of vinyl butyral, vinylalcohol and vinylacetate, esterified with trimellit acid, 13.9% by weight, commercially available from Clariant.
(2) FST 426R is a solution in 2-butanone containing 88.2% by weight of a reaction product from 1 mole of 2,2,4-trimethyl-hexamethylenediisocyanate and 2 moles of hydroxyethylmethacrylate (viscosity 3.30 mm$^2$/s at 25° C.).
(3) Mono Z1620 is a solution in 2-butanone containing 30.1% by weight of a reaction product from 1 mole of hexamethylenediisocyanate, 1 mole of 2-hydroxyethylmethacrylate and 0.5 mole of 2-(2-hydroxyethyl)-piperidine (viscosity 1.7 mm$^2$/s at 25° C.).
(4) Heliogene Blue D7490 dispersion (9.9% by weight, viscosity 7.0 mm$^2$/s at 25° C.), trade name of BASF, as defined in EP 1 072 956.
(5) DISB is 1,4-di[3,5-dimethoxy, 4-isobuthoxy-styryl]benzene.
(6) HABI is 2,2'-bis(2-chlorophenyl)-4,4',5,5'-tetraphenyl-1,2-bisimidazole.
(7) MBT is 2-mercaptobenzothiazole.
(8) Hostanox 03 is a phenolic antioxidant, commercially available from Clariant.
(9) Edaplan LA411 is a surfactant (solution of 10% by weight in Dowanol PM ® trade mark of Dow Chemical Company) obtained from Munzing Chemie.
(10) Dowanol PM is propylene glycol monomethylether, trade mark of Dow Chemical Company.

Preparation of Overcoat Layer OC-1:

On top of the photosensitive layer a solution in water with the composition as defined in Table 3 was coated and was dried at 110° C. for 2 minutes. The so-formed protective overcoat OC-1 has a dry thickness of 1 g/m$^2$.

TABLE 3

Composition of Overcoat Solution

| COMPONENT | OC-1 |
|---|---|
| partially hydrolyzed polyvinylalcohol (degree of hydrolysis 88%, viscosity 4 mPa · s in a solution of 4 wt. % at 20° C.) (g) | 9.73 |
| partially hydrolyzed polyvinylalcohol (degree of hydrolysis 88%, viscosity 8 mPa · s in a solution of 4 wt. % at 20° C.) (g) | 4.25 |
| fully hydrolyzed polyvinylalcohol (degree of hydrolysis 98%, viscosity 6 mPa · s in a solution of 4 wt. % at 20° C.) (g) | 8.50 |
| Acticide LA1206 (1) (g) | 0.05 |
| Lupasol P (2) (g) | 0.23 |
| Lutensol A8 (3) (g) | 0.22 |
| Water (g) | 977.03 |

(1) Acticide LA1206 is a biocide, commercially available from Thor.
(2) Lupasol P is a solution of 50% by weight of a polyethylene imine in water, commercially available from BASF.
(3) Lutensol A8 (90% by weight) is a surface active agent, commercially available from BASF.

Preparation of the Printing Plate

The precursor was imaged with an energy of 25 µJ/cm$^2$ in a violet plate setter device Advantage DL3850 (Addressability: 1270 dpi). After image-wise exposing the plate precursor was pre-heated and developed in a VSP-85 processor unit. Since a VSP-85 processing unit is designed for a conventional alkaline development of photopolymer printing plates, the configuration of the processor unit has been changed for this example. For this example only four sections are used: preheat section, pre-wash section, developer section and dry section. The wash and gum section are bypassed. The transport speed of the printing plates through the processor is 1.2 m/min.

In the pre-heat section, a plate temperature of 110° C. (measured on the backside of the printing plate precursor) is established.

After pre-heat the plate precursor is washed in the pre-wash section followed by development in the developer section. The pre-wash section (30 l) is filled with a Gum-1 solution, developer section (43 l) is also filled with a Gum-1 solution. The temperature of both the pre-wash and the developer sections is room temperature. Replenishment of the pre-wash (gum-1 solution) amounts to 15 ml/m$^2$, replenishment of the developer (gum-1 solution) also amounts to 15 ml/m$^2$.

The obtained plate exhibited an excellent clean-out and good prints without toning were obtained by printing on a Heidelberg GTO46 press. A good clean-out means that the coating is completely removed from the support at the non-exposed areas.

Gum-1 is a solution prepared as follow:
To 750 g demineralized water
100 ml of Dowfax 3B2 (commercially available from Dow Chemical)
31.25 g 1,3-benzene disulphonic acid disodium salt (available from Riedel de Haan)
31.25 ml Versa TL77 (a polystyrene sulphonic acid available from Alco Chemical)
10.4 g trisodium citrate dihydrate,
2 ml of Acticide LA1206 (a biocide from Thor),
2.08 g of Polyox WSRN-750 (available from Union Carbide) were added under stirring and demineralized water was further added to 1000 g.
pH is between 7.2 and 7.8.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method of making a lithographic printing plate comprising the steps of:
   a) providing a lithographic printing plate precursor including (i) a support having a hydrophilic surface or which is provided with a hydrophilic layer, (ii) a coating on the support, including a photopolymerizable layer and, optionally, an intermediate layer between the photopolymerizable layer and the support, wherein the photopolymerizable layer includes a polymerizable compound, a polymerization initiator, and a binder;
   b) image-wise exposing the coating by a laser in a plate setter;
   c) optionally, heating the precursor in a pre-heating unit; and
   d) treating the precursor in a gumming station, including a first and at least a second gumming unit, wherein the precursor is consecutively developed in the first and the second gumming units with a gum solution, thereby removing non-exposed areas of the photopolymerizable layer from the support and gumming the plate in a single step.

2. A method according to claim 1, wherein at least one of the gumming units is provided with at least one roller for rubbing and/or brushing the coating while a gum solution is applied to the precursor by a spraying, jetting, coating, or dipping technique.

3. A method according to claim 1, wherein the first and second gumming unit together have the configuration of a cascade system, wherein the gum solution used in the second gumming unit overflows to the first gumming unit.

4. A method according to claim 1, wherein a replenishing solution is added to the second gumming unit.

5. A method according to claim 1, wherein the gumming station further includes a third gumming unit wherein the precursor is further developed with a gum solution in the third gumming unit.

6. A method according to claim 5, wherein the first, second, and third gumming units together have the configuration of a cascade system, wherein the gum solution used in the third gumming unit overflows to the second gumming unit and the gum solution used in the second gumming unit overflows to the first gumming unit.

7. A method according to claim 5, wherein a replenishing solution is added to the third gumming unit.

8. A method according to claim 1, wherein the first and second gumming units are coupled to each other by a mechanical plate conveying device or integrated in a single apparatus.

9. A method according to claim 1, wherein the coating does not contain a top layer which acts as an oxygen barrier layer on the photopolymerizable layer.

10. A method according to claim 1, wherein the photopolymerizable layer further includes polymer particles.

11. A method according to claim 1, wherein the gum solution has a pH-value ranging between 3 and 9.

12. A method according to claim 1, wherein the laser emits violet light.

13. A method according to claim 1, wherein the laser emits infrared light.

* * * * *